United States Patent
Umayahara et al.

(10) Patent No.: US 10,450,219 B2
(45) Date of Patent: Oct. 22, 2019

(54) COMPOSITE POWDER, GREEN SHEET, LIGHT REFLECTIVE SUBSTRATE, AND LIGHT EMITTING DEVICE USING SAME

(71) Applicant: Nippon Electric Glass Co., Ltd., Shiga (JP)

(72) Inventors: Yoshio Umayahara, Shiga (JP); Kumiko Himei, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 0 days.

(21) Appl. No.: 16/090,621

(22) PCT Filed: Mar. 22, 2017

(86) PCT No.: PCT/JP2017/011488
§ 371 (c)(1),
(2) Date: Oct. 2, 2018

(87) PCT Pub. No.: WO2017/175587
PCT Pub. Date: Oct. 12, 2017

(65) Prior Publication Data
US 2019/0112223 A1    Apr. 18, 2019

(30) Foreign Application Priority Data

Apr. 5, 2016 (JP) ................. 2016-075648

(51) Int. Cl.

| | | |
|---|---|---|
| C03C 3/00 | (2006.01) | |
| C03C 14/00 | (2006.01) | |
| C03C 8/20 | (2006.01) | |
| C03C 8/02 | (2006.01) | |
| G02B 5/08 | (2006.01) | |
| H01L 33/60 | (2010.01) | |
| C03C 3/064 | (2006.01) | |
| C03C 3/066 | (2006.01) | |
| C03C 4/04 | (2006.01) | |
| G02B 5/02 | (2006.01) | |
| F21V 7/22 | (2018.01) | |

(52) U.S. Cl.
CPC ............. *C03C 8/20* (2013.01); *C03C 3/064* (2013.01); *C03C 3/066* (2013.01); *C03C 4/04* (2013.01); *C03C 8/02* (2013.01); *C03C 14/00* (2013.01); *G02B 5/0221* (2013.01); *G02B 5/08* (2013.01); *H01L 33/60* (2013.01); *C03C 2204/00* (2013.01); *C03C 2205/00* (2013.01); *F21V 7/22* (2013.01)

(58) Field of Classification Search
CPC .......... C03C 3/064; C03C 3/066; C03C 4/04; C03C 8/20; C03C 2204/00; C03C 2205/00; G02B 5/08; H01L 33/60; C04B 35/36; C04B 35/495
See application file for complete search history.

(56) References Cited

U.S. PATENT DOCUMENTS

| | | | |
|---|---|---|---|
| 2011/0001162 A1 | 1/2011 | Nakayama et al. | |
| 2015/0232375 A1* | 8/2015 | Ohta .................. | C03C 14/004 428/34.4 |

FOREIGN PATENT DOCUMENTS

| | | | |
|---|---|---|---|
| JP | 2003-2682 | 1/2003 | |
| JP | 2003002682 | * 1/2003 | ............. C03C 3/064 |
| JP | 2011-230964 | 11/2011 | |
| WO | 2009/128354 | 10/2009 | |
| WO | 2014/073604 | 5/2014 | |

OTHER PUBLICATIONS

International Search Report dated Jun. 20, 2017 in International Application No. PCT/JP2017/011488.

* cited by examiner

*Primary Examiner* — Bijan Ahvazi
(74) *Attorney, Agent, or Firm* — Wenderoth, Lind & Ponack, L.L.P.

(57) ABSTRACT

A composite powder of the present invention includes a glass powder and a ceramic powder, wherein a content of the glass powder is from 30 vol % to 60 vol %, wherein a content of the ceramic powder is from 40 vol % to 70 vol %, wherein the glass powder includes as a glass composition, in terms of mass %, 10% to 30% of $SiO_2$, more than 20% to 40% of $B_2O_3$, 20% to 40% of SrO+BaO, 0% to 10% of $Al_2O_3$, and 0% to 15% of ZnO, and wherein the composite powder is used for a light reflective substrate.

8 Claims, No Drawings

COMPOSITE POWDER, GREEN SHEET, LIGHT REFLECTIVE SUBSTRATE, AND LIGHT EMITTING DEVICE USING SAME

TECHNICAL FIELD

The present invention relates to a composite powder having high light reflectivity, a green sheet, a light reflective substrate, and a light emitting device using the same.

BACKGROUND ART

An LED is a small light source with low power consumption. A white LED has attracted attention as an illumination device alternative to an incandescent lamp and a fluorescent lamp. In addition, an ultraviolet LED has attracted attention as an ultraviolet light source in applications including sterilization, air cleaning, cancer treatment, and resin curing.

In order to effectively utilize light emitted from a light emitting body in a device including the LED, a light reflective substrate having a high light reflectance is required.

For example, alumina ceramic having a relatively high light reflectance, or alumina ceramic having formed thereon a light reflective film formed of a metal is used as the light reflective substrate. However, such light reflective substrate cannot provide a sufficient quantity of light. Therefore, a further increase in light reflectance is required for the light reflective substrate.

CITATION LIST

Patent Literature 1: JP 2011-230964 A

SUMMARY OF INVENTION

Technical Problem

In Patent Literature 1, there is a disclosure of a light reflective substrate having a light reflectance of 85% or more. Specifically, the light reflective substrate described in Patent Literature 1 is a sintered body of a composite powder, wherein the composite powder comprises 30 mass % to 50 mass % of a glass powder, 35 mass % to 60 mass % of an alumina powder, and further, 10 mass % to 20 mass % of a zirconia powder, and the glass powder comprises as a glass composition 45 mass % to 65 mass % of $SiO_2$, 5 mass % to 20 mass % of $B_2O_3$, 5 mass % to 25 mass % of $Al_2O_3$, and 15 mass % to 35 mass % of CaO.

However, the light reflective substrate described in Patent Literature 1 is fired at a relatively high temperature (925° C.). Therefore, when the light reflective substrate is fired simultaneously with a silver paste for wiring, there is a risk in that a short circuit occurs in wiring. While silver has a melting point of 962° C., the silver paste for wiring includes an additive in addition to silver, and hence it is recommended that the silver paste for wiring be fired at a temperature of 900° C. or less.

The present invention has been made in view of the above-mentioned circumstances, and a technical object of the present invention is to provide a material for a light reflective substrate which exhibits a high light reflectance, and can be sintered densely at a temperature of 900° C. or less.

Solution to Problem

The inventors of the present invention have found that the above-mentioned technical object can be achieved when a glass powder having a specific composition is used in a composite powder comprising a glass powder and a ceramic powder. Thus, the finding is proposed as the present invention. That is, according to one embodiment of the present invention, there is provided a composite powder, comprising a glass powder and a ceramic powder, wherein a content of the glass powder is from 30 vol % to 60 vol %, wherein a content of the ceramic powder is from 40 vol % to 70 vol %, wherein the glass powder comprises as a glass composition, in terms of mass %, 10% to 30% of $SiO_2$, more than 20% to 40% of $B_2O_3$, 20% to 40% of SrO+BaO, 0% to 10% of $Al_2O_3$, and 0% to 15% of ZnO, and wherein the composite powder is used for a light reflective substrate. Herein, the content of "SrO+BaO" refers to the total content of SrO and BaO.

In the composite powder according to the embodiment of the present invention, the contents of $SiO_2$, $B_2O_3$, and SrO+BaO in the glass powder are restricted to 30 mass % or less, more than 20 mass %, and 20 mass % or more, respectively. With this, a low-temperature sintering property is improved, and hence a dense light reflective substrate can be obtained at a temperature of 900° C. or less.

Further, the composite powder according to the embodiment of the present invention comprises the ceramic powder at a content of from 40 vol % to 70 vol %. With this, the light reflectance and the mechanical strength of the light reflective substrate can be increased.

Secondly, it is preferred that the composite powder according to the embodiment of the present invention comprise alumina and zirconia as the ceramic powder.

Thirdly, a green sheet according to one embodiment of the present invention is preferably a green sheet, comprising a composite powder, wherein the composite powder comprises the composite powder described above.

Fourthly, a light reflective substrate according to one embodiment of the present invention is preferably a light reflective substrate, comprising a sintered body of a composite powder, wherein the composite powder comprises the composite powder described above.

Fifthly, a light emitting device according to one embodiment of the present invention preferably comprises the light reflective substrate described above.

DESCRIPTION OF EMBODIMENTS

A glass powder according to the present invention comprises as a glass composition, in terms of mass %, 10% to 30% of $SiO_2$, more than 20% to 40% of $B_2O_3$, 20% to 40% of SrO+BaO, 0% to 10% of $Al_2O_3$, and 0% to 15% of ZnO. The reason why the glass composition of the glass powder is restricted as described above is as described below.

$SiO_2$ is a component which enhances chemical durability, and the content of $SiO_2$ is from 10% to 30%, preferably from 20% to 28%. When the content of $SiO_2$ is too small, weather resistance tends to be significantly reduced. Meanwhile, when the content of $SiO_2$ is too large, low-temperature sintering becomes difficult.

$B_2O_3$ is a component which reduces a liquidus temperature while enhancing a low-temperature sintering property. The content of $B_2O_3$ is more than 20% to 40%, preferably from 25% to 32%. When the content of $B_2O_3$ is too small, the low-temperature sintering property is reduced. In addition to that, glass is liable to be devitrified at the time of forming. Meanwhile, when the content of $B_2O_3$ is too large, the weather resistance tends to be reduced.

SrO and BaO are each a component which enhances the low-temperature sintering property and a refractive index.

The content of SrO and BaO is from 20% to 40%, preferably from 32% to 38%. The content of SrO is preferably from 5% to 30%, particularly preferably from 8% to 22%. The content of BaO is preferably from 10% to 35%, particularly preferably from 15% to 25%. When the content of SrO and BaO is too small, the low-temperature sintering becomes difficult. Meanwhile, when the content of SrO and BaO is too large, the glass is liable to be devitrified at the time of forming.

$Al_2O_3$ is a component which improves meltability and the weather resistance, and the content of $Al_2O_3$ is from 0% to 10%, preferably from 1% to 7%. When the content of $Al_2O_3$ is too large, the glass is liable to be devitrified at the time of forming.

ZnO is a component which improves the meltability, and the content of ZnO is from 0% to 15%, preferably from 1% to 12%. When the content of ZnO is too large, the weather resistance is liable to be reduced.

In addition to the above-mentioned components, any other component, such as $Li_2O$, $Na_2O$, $K_2O$, MgO, CaO, $TiO_2$, or $ZrO_2$, may be introduced at a content of up to 10% (preferably 5%, particularly preferably 1%).

In a composite powder of the present invention, the content of the glass powder is from 30 vol % to 60 vol %, preferably from 40 vol % to 55 vol %, and the content of a ceramic powder is from 40 vol % to 70 vol %, preferably from 45 vol % to 60 vol %. When the content of the glass powder is too small, that is, the content of the ceramic powder is too large, the denseness of a sintered body is liable to be reduced. Meanwhile, when the content of the glass powder is too large, that is, the content of the ceramic powder is too small, light reflectivity is liable to be reduced, and the mechanical strength of the sintered body is liable to be reduced.

In the composite powder of the present invention, the average particle diameter $D_{50}$ of the glass powder is not particularly limited, but when the average particle diameter $D_{50}$ of the glass powder is too large, the light reflectance and the mechanical strength of a light reflective substrate are liable to be reduced. Therefore, the average particle diameter $D_{50}$ of the glass powder is preferably 15 μm or less, particularly preferably 7 μm or less. Meanwhile, when the average particle diameter $D_{50}$ of the glass powder is too small, production cost is increased. Therefore, the average particle diameter $D_{50}$ of the glass powder is preferably 0.5 μm or more, particularly preferably 1.5 μm or more. Herein, the "average particle diameter $D_{50}$" refers to a value measured by laser diffractometry, and represents, in a cumulative particle size distribution curve on a volume basis measured by the laser diffractometry, a particle diameter at which the integration amount of particles from a smaller particle side is 50% in a cumulative manner.

It is preferred to introduce alumina and zirconia as the ceramic powder. Alumina and zirconia each have a property of increasing a light reflectance of visible light to ultraviolet light, and increasing the mechanical strength. In particular, zirconia has a higher effect than alumina, but when only zirconia is introduced, material cost of the composite powder is increased. Therefore, it is preferred to introduce both alumina and zirconia as the ceramic powder. The content of alumina is preferably from 25 vol % to 60 vol %, particularly preferably from 30 vol % to 55 vol %, and the content of zirconia is preferably from 2 vol % to 15 vol %, particularly preferably from 4 vol % to 12 vol %.

The composite powder of the present invention is preformed into a shape, such as a plate shape, a sheet form, or a block form, and is then subjected to a firing step. Various methods may be adopted as a pre-forming method. For example, a green sheet (tape) forming method, a slip casting method, a screen printing method, a mold pressing method, an aerosol deposition method, a spin coating method, or a die coating method may be adopted.

The green sheet forming method is a method involving adding a resin binder, a plasticizer, and a solvent to the composite powder and kneading the resultant to produce a slurry, followed by producing a green sheet (tape) with a sheet forming machine, such as a doctor blade. According to this method, in the course of producing a light reflective substrate by, for example, laminating the green sheets, it is possible to form a circuit in the substrate, to embed a metal material having high thermal conductivity by forming an electrical via, and to form a heat dissipation passage through a thermal via.

The screen printing method is a method involving adding a resin binder and a solvent to the composite powder and kneading the resultant to produce a high-viscosity paste, followed by forming a film on a surface of a substrate with a screen printing machine. According to this method, a light reflecting portion of a specific pattern can be easily formed on the surface of the substrate. Further, a film having a film thickness of from about several microns to about several hundred microns can be easily formed by adjusting the viscosity of the paste, a screen thickness, the number of times of printing, and the like.

A light reflective substrate of the present invention is preferably a light reflective substrate, comprising a sintered body of a composite powder, wherein the composite powder is the composite powder described above. The light reflective substrate of the present invention has a total light reflectance at a wavelength of 550 nm of preferably 80% or more or 85% or more, particularly preferably 90% or more, and has a total light reflectance at a wavelength of 280 nm of preferably 60% or more or 70% or more, particularly preferably 78% or more.

A light transmissive functional layer may be formed on a surface of the light reflective substrate. For example, a protective coating against scratches, contamination, chemical corrosion, or the like, a wavelength filter layer, a light diffusion layer, or an interference layer may be formed.

A material for the functional layer is not particularly limited, and glass, such as silicate-based glass, a metal oxide, such as silica, alumina, zirconia, tantalum oxide, or niobium oxide, and a resin, such as polymethyl methacrylate, polycarbonate, or polyacrylate, may be used.

EXAMPLES

The present invention is described in detail by way of Examples. However, Examples below are merely examples, and the present invention is by no means limited to Examples below.

Examples (Sample Nos. 1 to 4) and Comparative Example (Sample No. 5) of the present invention are shown in Table 1.

TABLE 1

|  |  | No. 1 | No. 2 | No. 3 | No. 4 | No. 5 |
|---|---|---|---|---|---|---|
| Glass | $SiO_2$ | 28 | 25 | 26 | 20 | 47 |
| composition | $B_2O_3$ | 29 | 28 | 26 | 30 | 18 |
| (mass %) | SrO | 18 | 15 | 15 | 12 | 10 |
|  | BaO | 18 | 20 | 23 | 24 | 10 |
|  | $Al_2O_3$ | 4 | 0 | 10 | 6 | 15 |
|  | ZnO | 3 | 12 | 0 | 8 | 0 |

TABLE 1-continued

|  |  | No. 1 | No. 2 | No. 3 | No. 4 | No. 5 |
|---|---|---|---|---|---|---|
| Composition of composite powder (vol %) | Glass | 47 | 52 | 50 | 45 | 50 |
|  | Alumina | 45 | 38 | 45 | 48 | 40 |
|  | Zirconia | 8 | 10 | 5 | 7 | 10 |
| Firing temperature (° C.) |  | 890 | 890 | 890 | 890 | 890 |
| Ink test |  | ○ | ○ | ○ | ○ | x |
| Light reflectance (%) | 550 nm | 96 | 97 | 96 | 97 | 96 |
|  | 280 nm | 79 | 80 | 78 | 79 | 77 |

Each of Samples was produced as described below. First, glass raw material powders were blended so as to give a glass composition shown in Table 1 to provide a glass batch. Next, the glass batch was loaded into a platinum crucible, and then melted in an electric furnace kept at from 1,400° C. to 1,600° C. for 2 hours. The resultant glass melt was poured between a pair of water-cooling rollers to provide glass in a film form. Further, the glass in a film form was pulverized with an alumina ball mill, followed by air classification. Thus, a glass powder having an average particle diameter $D_{50}$ of 3 μm was obtained.

Next, the resultant glass powder and the ceramic powder shown in Table 1 were mixed at a ratio shown in Table 1. Thus, a composite powder was obtained. The composite powder was subjected to press forming in a mold of 20 mmφ to produce cylindrical pellets, and then fired in an electric furnace at 890° C. for 20 minutes. Thus, a sintered body (light reflective substrate) was obtained.

The resultant sintered body was subjected to an ink test for confirming a sintering property and to measurement of light reflectances. The results thereof are shown in Table 1.

In the ink test, an oil-based ink was applied onto a surface of the sintered body, and then alcohol washing was performed. At this time, a case in which no ink remains is evaluated as "○", and a case in which any ink remains is evaluated as "x".

The light reflectances are total light reflectances at wavelengths of 550 nm and 280 nm measured with a spectrophotometer.

As shown in Table 1, Sample Nos. 1 to 4 were each densely sintered at a firing temperature of 890° C., and further, had a total light reflectance at a wavelength of 550 nm of 96% or more and a total light reflectance at a wavelength of 280 nm of 78% or more. Meanwhile, Sample No. 5 was not densely sintered at a firing temperature of 890° C.

INDUSTRIAL APPLICABILITY

The light reflective substrate of the present invention can be suitably used for an LED package, a display, such as an OLED display, lighting for automobiles, general lighting, and the like.

The invention claimed is:

1. A composite powder, comprising a glass powder and a ceramic powder,
    wherein a content of the glass powder is from 30 vol % to 60 vol %,
    wherein a content of the ceramic powder is from 40 vol % to 70 vol %,
    wherein the glass powder comprises as a glass composition, in terms of mass %, 10% to 30% of $SiO_2$, more than 20% to 40% of $B_2O_3$, 20% to 40% of SrO+BaO, 1% to 7% of $Al_2O_3$, and 1% to 15% of ZnO,
    wherein the composite powder is used for a light reflective substrate, and
    wherein the glass powder comprises as the glass composition, in terms of mass %, 10% or less of component(s) other than $SiO_2$, $B_2O_3$, SrO, BaO, $Al_2O_3$, and ZnO.

2. The composite powder according to claim 1, wherein the composite powder comprises alumina and zirconia as the ceramic powder.

3. A green sheet, comprising a composite powder,
    wherein the composite powder comprises the composite powder of claim 2.

4. A light reflective substrate, comprising a sintered body of a composite powder,
    wherein the composite powder comprises the composite powder of claim 2.

5. A green sheet, comprising a composite powder,
    wherein the composite powder comprises the composite powder of claim 1.

6. A light reflective substrate, comprising a sintered body of a composite powder,
    wherein the composite powder comprises the composite powder of claim 1.

7. A light emitting device, comprising the light reflective substrate of claim 6.

8. The composite powder according to claim 1, wherein the glass powder comprises as the glass composition, in terms of mass %, 26% to 40% of $B_2O_3$.

* * * * *